United States Patent [19]

Older et al.

[11] B 3,922,479

[45] Nov. 25, 1975

[54] COAXIAL CIRCUIT CONSTRUCTION AND METHOD OF MAKING

[75] Inventors: Robert B. Older, Woodland Hills; Charles W. Smith, Canoga Park, both of Calif.

[73] Assignee: The Bunker-Ramo Corporation, Oak Brook, Ill.

[22] Filed: Jan. 28, 1974

[21] Appl. No.: 437,450

[44] Published under the Trial Voluntary Protest Program on January 28, 1975 as document no. B 437,450.

Related U.S. Application Data

[60] Continuation of Ser. No. 180,886, Sept. 15, 1971, abandoned, which is a division of Ser. No. 858,923, Sept. 18, 1969, Pat. No. 3,649,274.

[52] U.S. Cl. .......... 174/68.5; 29/625; 317/101 CM

[51] Int. Cl.$^2$ .......... H05K 1/02

[58] Field of Search .......... 174/68.5, 35 R, 36; 317/101 A, 101 CM; 29/624, 625

[56] References Cited

UNITED STATES PATENTS

| | | | |
|---|---|---|---|
| 3,366,519 | 1/1968 | Pritchard, Jr. et al. | 174/68.5 UX |
| 3,391,454 | 7/1968 | Reimann et al. | 174/68.5 X |
| 3,508,325 | 4/1970 | Perry | 317/101 A X |

*Primary Examiner*—Darrell L. Clay
*Attorney, Agent, or Firm*—F. M. Arbuckle; D. R. Bair

[57] ABSTRACT

A coaxial circuit construction and method of making in which an up-plated coaxial structure is fabricated by successively applying layers of metal and photo-polymer material, the photo-polymer layers being photographically processed to form patterns which provide the required insulation, and the metal layers being formed by up-plating and precision grinding.

5 Claims, 20 Drawing Figures

COAXIAL CIRCUIT CONSTRUCTION AND METHOD OF MAKING

Figure 1:
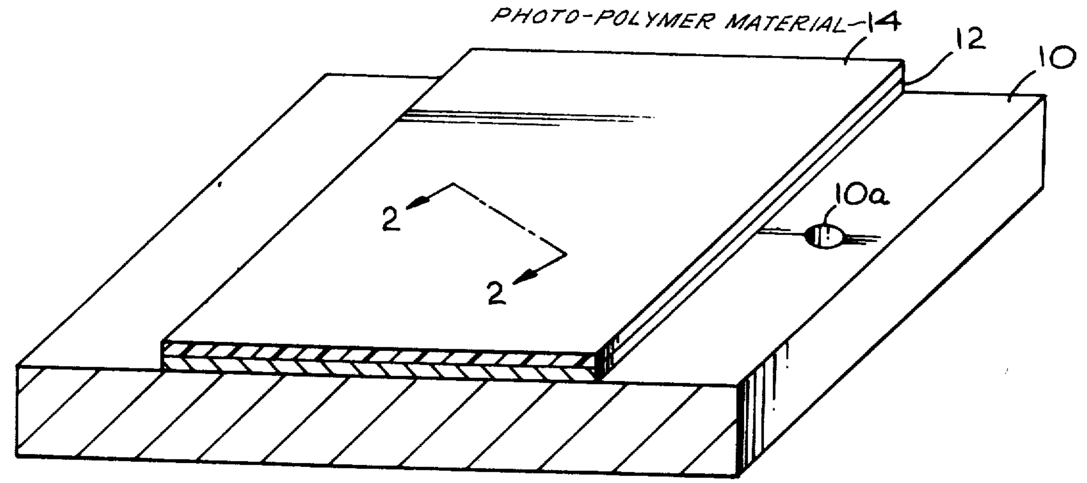

This application is a continuation of patent application Ser. No. 180,886, filed Sept. 15, 1971, now abandoned which in turn is a division of patent application Ser. No. 858,923, filed Sept. 18, 1969, now U.S. Pat. No. 3,649,274, issued Mar. 14, 1972.

This invention relates to a coaxial circuit construction and method of making.

In recent years, considerable attention has been directed to improved coaxial circuit constructions and techniques for fabrication thereof as indicated, for example, by the constructions and techniques disclosed in U.S. Pat. Nos. 3,351,702; 3,351,816; 3,351,953; and 3,391,454.

In accordance with the objects and purposes of the present invention, a coaxial circuit construction and method of fabrication are disclosed for providing an up-plated coaxial structure in which the required insulation between the coaxial conductors is provided by a plurality of selectively processed layers of a photo-polymer material which is also able to serve as a satisfactory electrical insulative material between the conductors. Such an approach results in an improved construction which can be fabricated in a remarkably simple and inexpensive manner as compared to presently known techniques.

The specific nature of the invention as well as other objects, advantages and uses thereof will become apparent from the following description of an exemplary embodiment taken in conjunction with the accompanying drawings in which:

FIGS. 1–20 are fragmentary pictorial and crosssectional views illustrating various stages of construction in preparing coaxial circuitry in accordance with the invention.

FIGS. 2, 4, 6, 8, 10, 12 and 13, 15 and 16, and 18 and 19 are cross-sectional views taken along the correspondingly numbered sectioning lines indicated in the respective pictorial views of FIGS. 1, 3, 5, 7, 9, 11, 14, and 17.

Like characters refer to like elements throughout the figures of the drawings. For greater clarity, the thicknesses of various layers in the drawings have been exaggerated. Also, for additional clarity, FIGS. 1–19 of the drawings are restricted to illustrating the fabrication of only a single coaxial conductor. However, it is to be understood that a plurality of such coaxial conductors having desired predetermined patterns are ordinarily batch fabricated at the same time. Accordingly, when considering FIGS. 1–19 with the description herein provided, it should be recognized that like operations may also be simultaneously performed for other coaxial conductors.

Figure 2:
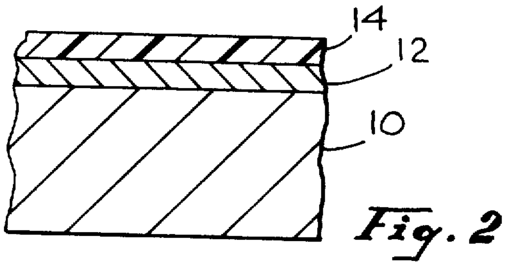

Referring to FIGS. 1 and 2, illustrated therein is a stainless steel carrier block 10 which serves as a temporary carrier throughout the fabrication process. The block 10 is of sufficient size to include the desired coaxial conductor circuit pattern and is also provided with registration holes, such as illustrated by the hole **10*a*. A metal base layer or foil 12, which may, for example, be copper or nickel, is bonded to the carrier block 10 preferably using jewelers' wax so that the completed coaxial circuit structure can easily be removed to permit the carrier block 10** to be reused.

As illustrated in FIGS. 1 and 2, a first photo-polymer layer 14 is provided over the metal base layer 12, such as by being rolled on or solvent-bonded. It is important that the photo-polymer layer 14, as well as the other photo-polymer layers provided later on in the fabrication process, have the dual capability of being able to be selectively photographically processed as well as being able to serve as a satisfactory electrical insulative material for the resultant coaxial circuitry. An example of a suitable photo-polymer is a polyester copolymer available from DuPont under the trademark "Riston," and which may be rolled on over the metal base layer 12 in FIGS. 1 and 2 to provide the photo-polymer layer 14. Another example of a suitable photo-polymer is "Templex," also a trademarked product of DuPont.

Figure 3:
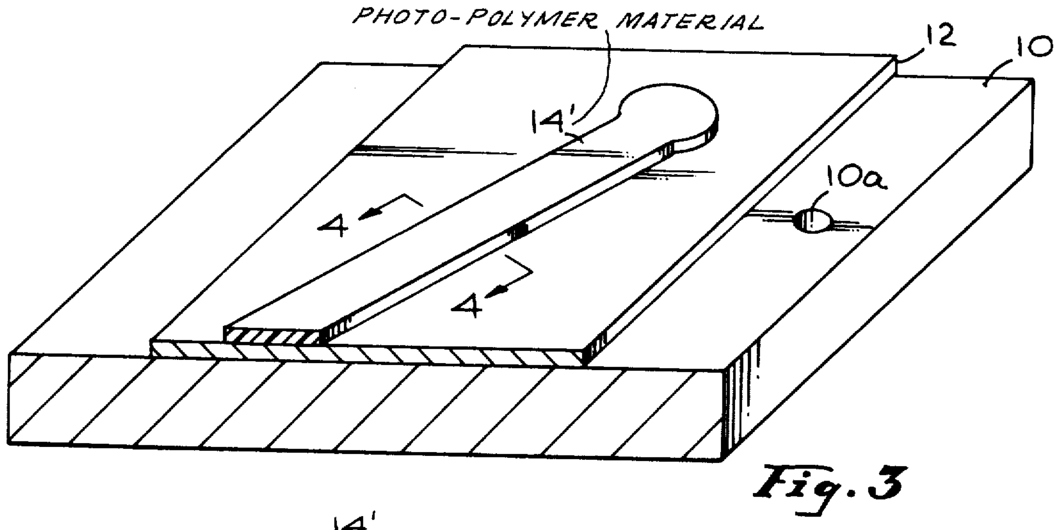
Figure 4:
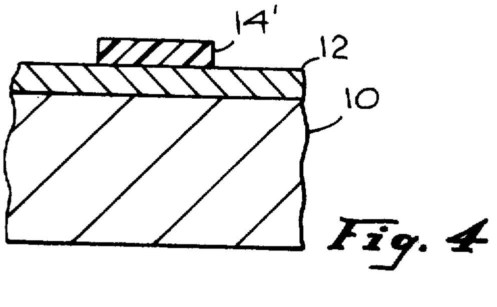

The next step in the fabrication process is to selectively process the photo-polymer layer 14 to provide a desired photo-polymer layer pattern on the base plate 12, such as typically illustrated by the single elongated photo-polymer strip 14' shown in FIGS. 3 and 4. This is typically accomplished by selectively exposing to light the surface of the photo-polymer layer 14 in those areas which are to be retained, and then removing the unexposed areas of the photo-polymer layer 14 by photographic developing.

Figure 5:
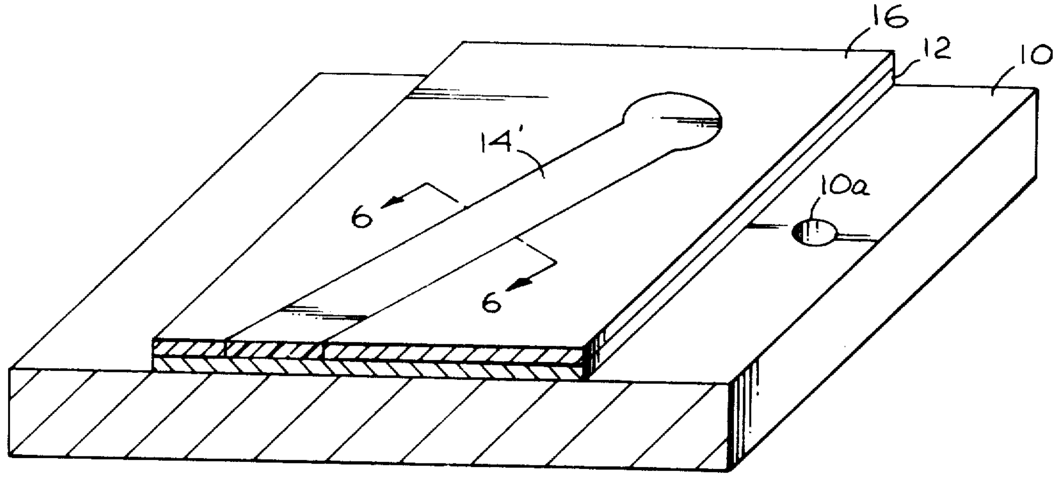
Figure 6:
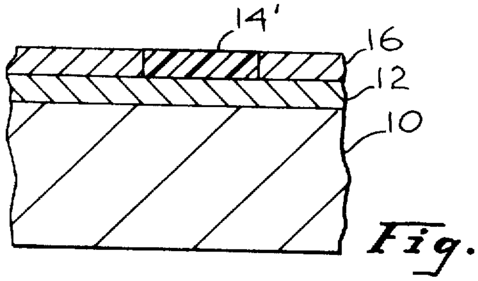

With reference now to FIGS. 5 and 6, well known plating techniques are employed to up-plate the metal base layer 12 of the structure of FIGS. 3 and 4 to a level to or above the surface of the photo-polymer layer pattern 14'. Precision grinding techniques employing, for example, a planetary grinder or precision surface sander, are then used to make the resulting up-plated layer 16 flush with the surface of the photo-polymer layer pattern 14', as illustrated in FIGS. 5 and 6.

Figure 7:
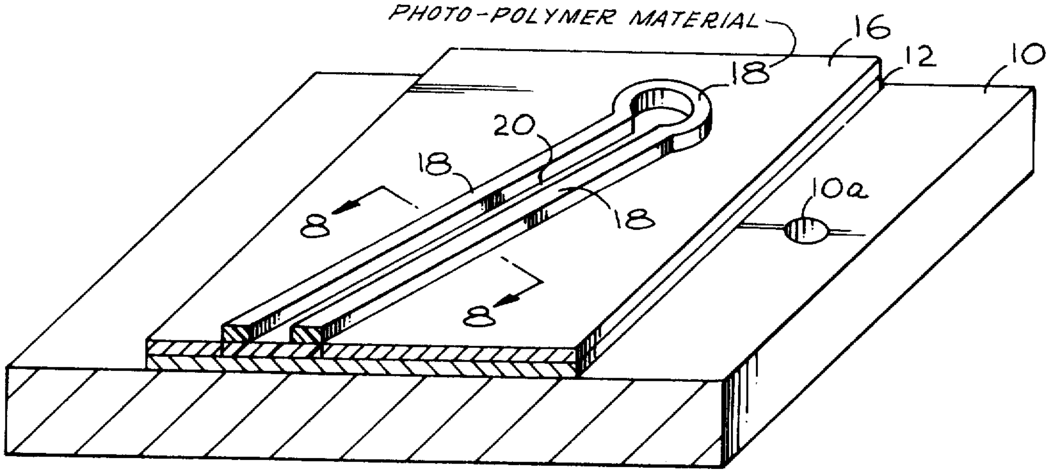
Figure 8:
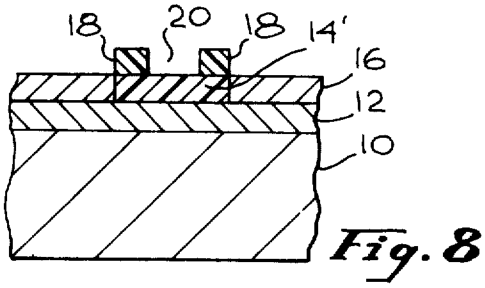

Next, a second layer of photo-polymer material is provided on the resulting flush surface of the structure of FIGS. 5 and 6. As illustrated in FIGS. 7 and 8, this second photo-polymer layer is selectively exposed and developed to form a second photo-polymer layer pattern 18 around the peripheral edges of the first photo-polymer layer pattern 14' so as to form a recess 20 for receiving the metal material which is to constitute the inner coaxial conductor of the completed coaxial structure. This inner coaxial conductor is formed during the next step, in which up-plating and precision grinding are again employed to provide metal layers 22 and 24 in FIGS. 9 and 10 which are flush with the surface of the second photo-polymer layer pattern 18. The flush, electrically insulated metal layer 22 within the cavity 20 constitutes the inner coaxial conductor of the completed structure.

Figure 9:
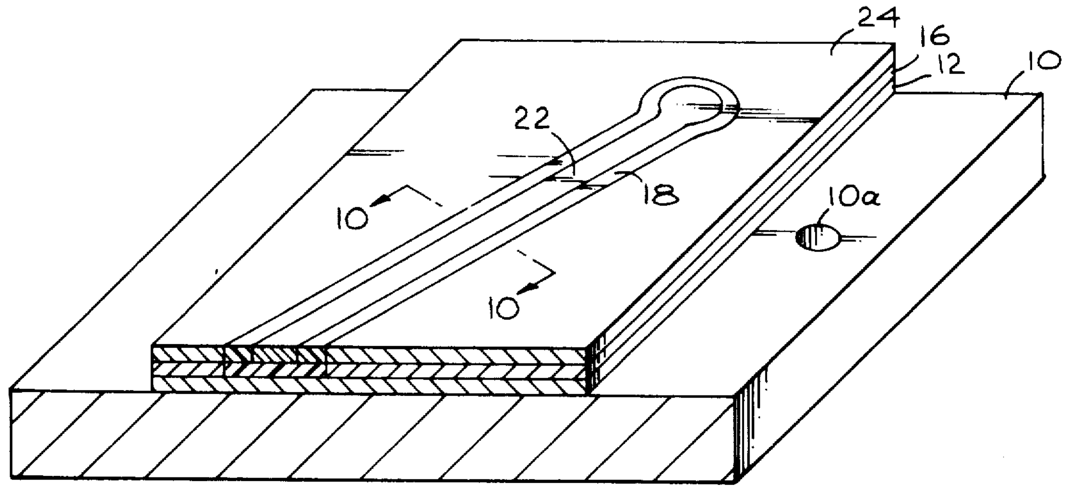
Figure 10:
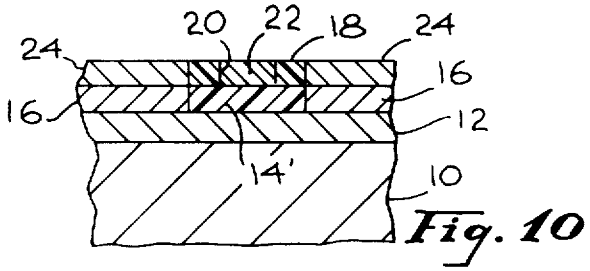
Figure 11:
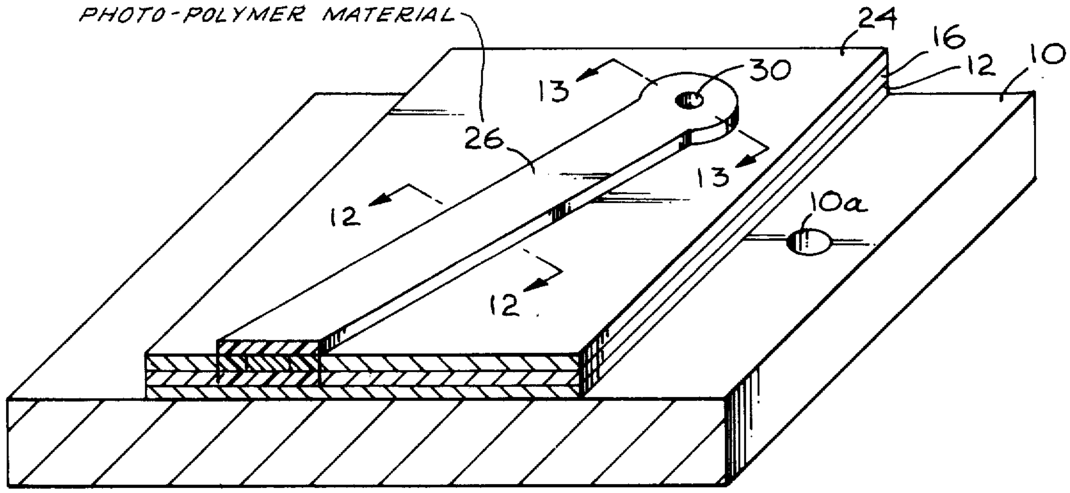
Figures 12, 13:
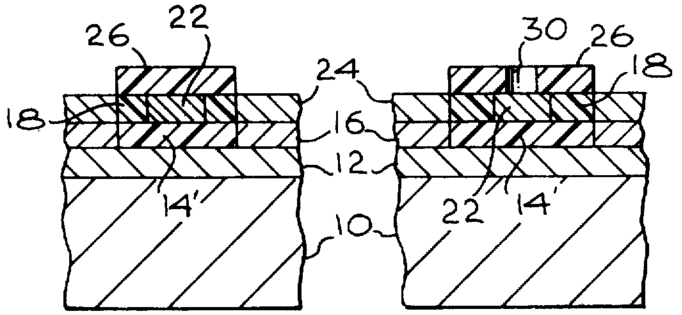
Figures 14, 15, 16:
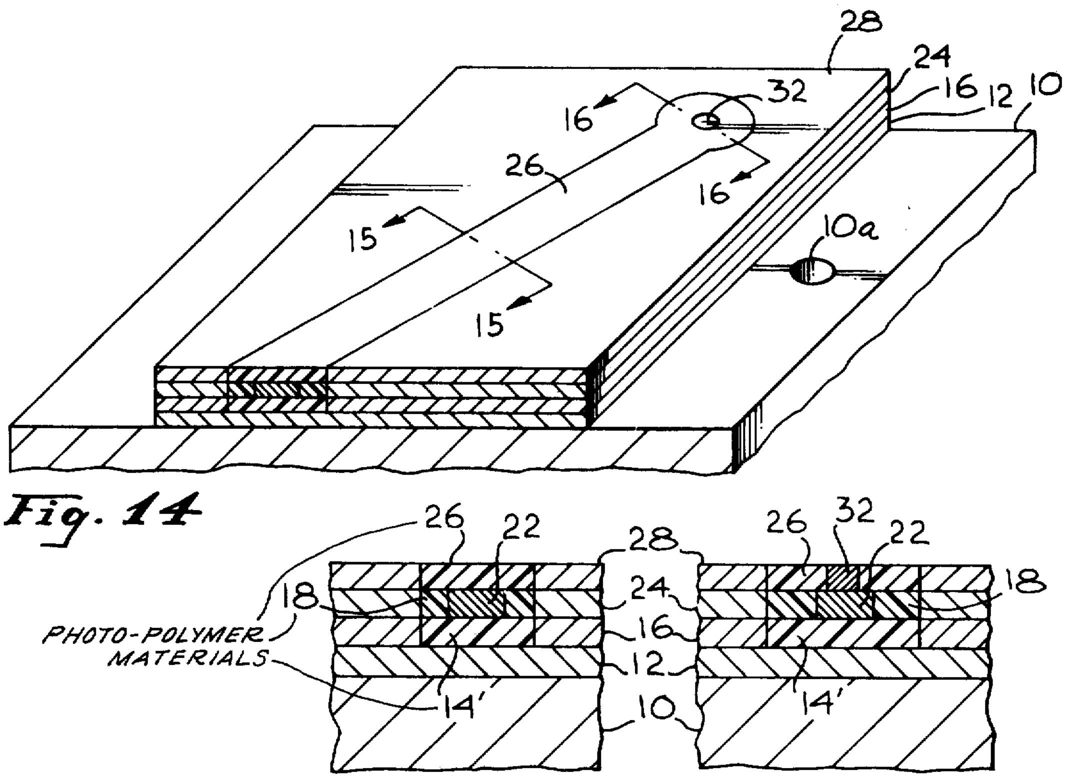

The next step in the fabrication process is to provide a third photo-polymer layer on the resulting flush surface of the structure of FIGS. 9 and 10. As illustrated in FIGS. 11–13, this third photo-polymer layer is selectively processed to form a third photo-polymer layer pattern 26 over the first and second photo-polymer layer patterns 14' and 18 so that photo-polymer material completely encloses the metal layer 22 constituting the inner coaxial conductor, except for the provision of an opening 30 at one end for feedthrough purposes. As illustrated in FIGS. 14–16, up-plating and precision grinding are then once again employed to provide metal layers 28 and 32 flush with the surface of the third photo-polymer layer pattern 26, the metal layer 32 serving to provide electrical feedthrough to the inner coaxial conductor 22.

Figure 17:
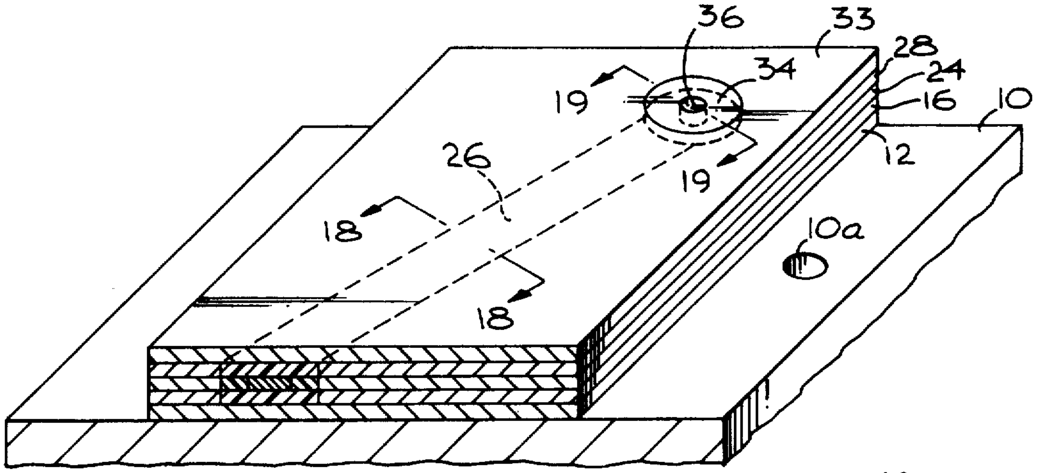
Figures 18, 19:
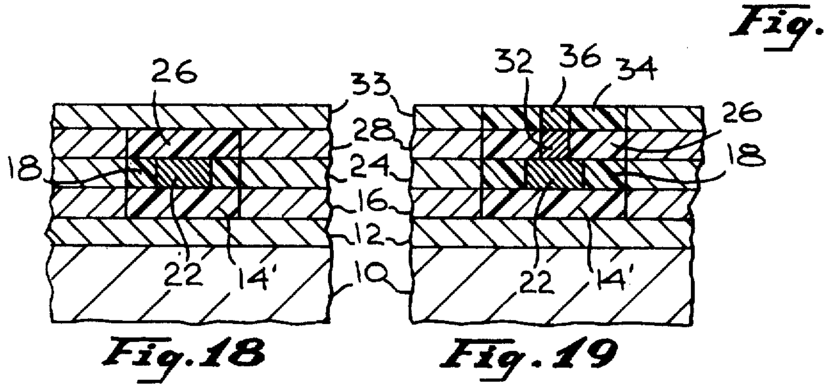

A fourth layer of photo-polymer material is next provided on the resulting flush surface of the structure of FIGS. 14–16. As illustrated in FIGS. 17–19, this fourth photo-polymer layer is processed to form a fourth photo-polymer layer pattern 34 forming an insulative ring around the feedthrough metal layer 32, following which up-plating and precision grinding are again employed to provide metal layers 33 and 36 flush with the fourth photo-polymer layer pattern 34. It will thus be understood that complete conductive encirclement of the inner coaxial conductor 22 will have been provided, except for the relatively small photo-polymer area provided by the fourth photo-polymer layer pattern 34 insulating the metal feedthrough layer 36.

The coaxial structure of FIGS. 17–19 may be removed from the carrier plate 10 by appropriate heating. Such a planar coaxial structure containing a plurality of coaxial conductors fabricated as illustrated in FIGS. 1–19 could then be suitably interconnected to electrical components and/or stacked with like or other planar structures in various ways known to the art. If feedthrough connections are desired on both sides, such may be provided by initially providing insulated through-terminals in the base metal layer 12 flush with the surfaces thereof. The first photo-polymer pattern would then be formed so as to provide a small feedthrough opening over each terminal, each such opening being filled with metal during the first up-plating operation so as to provide the desired feedthroughs.

Figure 20:
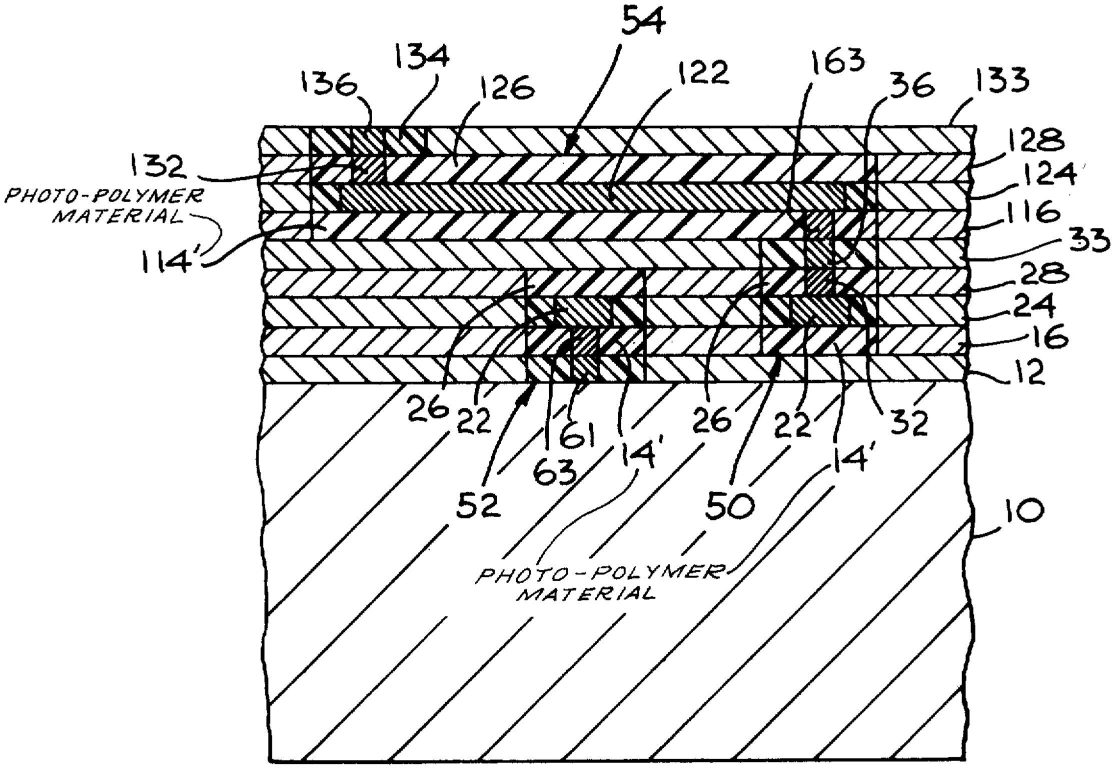

Although the coaxial structure illustrated in FIGS. 17–19 could be removed from the carrier plate 10 and used as a single planar coaxial structure or stacked with other planar structures, as pointed out above, it is to be noted that additional metal and photo-polymer layers could be applied in accordance with the invention to provide a three-dimensional structure having a plurality of electrically interconnected levels of coaxial conductors, as illustrated in FIG. 20.

With reference to FIG. 20, a two-level three-dimensional coaxial structure is illustrated having three coaxial conductors 50, 52 and 54. The coaxial conductors 50 and 52 are on the lower level and parallel to each other, and the coaxial conductor 54 is on the upper level and perpendicular to the coaxial conductors 50 and 52. For ready comparison and understanding, upper level elements are designated with numerals 100 greater than those used for respectively corresponding lower level elements. Also, it is to be noted that the top layer 33 of the lower level is the base layer of the upper level.

FIG. 20 further illustrates how a feedthrough connection may typically be provided to the coaxial conductor 52 from the bottom surface of the base layer 12. This is accomplished by the provision of an insulated terminal 61 in the base layer 12 which is electrically connected to the inner coaxial conductor 22 via a metal layer 63 formed during the first up-plating operation in an appropriately located opening provided in the first photo-polymer layer pattern 14'. FIG. 20 additionally illustrates how the inner coaxial conductor 22 of the coaxial conductor 50 may be electrically connected, via feedthroughs 32, 36, and 163, to the inner coaxial conductor 122 of the coaxial conductor 54, and how the inner coaxial conductor 122 of the coaxial conductor 54 is in turn fed to the upper surface of the structure of FIG. 20 via feedthroughs 132 and 136.

It is to be understood that the specific forms of the invention described herein are only exemplary, and that the invention is subject to a wide variety of possible modifications and variations in fabrication, construction and use without departing from the scope of the invention as defined by the appended claims.

We claim:

1. An electrical circuit construction providing at least one coaxial conductor comprising:

a stack of at least first, second, third, fourth and fifth adjacent contacting layers, said second, third and fourth layers being disposed between said first and fifth layers with adjacent surfaces in contact and with said third layer in the middle, each of said first, second and third layers comprising separate portions of conductive and photo-polymer materials provided in a predetermined pattern with the outer surfaces of the conductive and photo-polymer material portions of each layer being of equal thickness and flush with one another, said second and fourth layers having predetermined patterns such that each of said second and fourth layers comprises a conductive material portion surrounding a photo-polymer material path portion following a path corresponding to a predetermined path desired for said coaxial conductor and located so as to be oppositely disposed with respect to a like photo-polymer material path portion provided for the other of said second and fourth layers, said third layer having a predetermined pattern such that said third layer comprises a conductive material portion surrounding a pair of spaced parallel photo-polymer material path portions likewise following said predetermined path and which in turn border and electrically isolate a conductive material path portion provided therebetween and constituting said coaxial conductor, said spaced photo-polymer material path portions and said conductive material path therebetween provided in said third layer being disposed and dimensioned with respect to said photo-polymer path portions of said second and fourth layers so that said conductive material path portion of said third layer constituting said coaxial conductor is in contact with and completely encircled by photo-polymer material portions of said second, third and fourth layers, and said first and fifth layers each providing conductive material overlapping said photo-polymer path portion on the respective one of said second and fourth layers to which it is adjacent and making contact with said surrounding conductive material path portion of said third layer constituting said coaxial conductor and encircling photo-polymer portions are in turn completely encircled by conductive material portions of said first, second, third, fourth and fifth layers, said stack being additionally provided with sixth, seventh, eighth and ninth adjacent contacting layers constructed and arranged in a like manner as said second, third, fourth and fifth layers, respectively, and having predetermined patterns forming a second coaxial conductor in said seventh layer following a desired predetermined path.

2. The invention in accordance with claim 1, wherein said photo-polymer material is a light-exposed polyester copolymer.

3. The invention in accordance with claim 1, wherein one of said first and fifth layers and the adjacent one of said second and fourth layers have predetermined patterns of conductive and photo-polymer material providing an insulated coaxial feedthrough connection to said coaxial conductor.

4. The invention in accordance with claim 1, wherein said fourth, fifth and sixth layers have predetermined patterns of conductive and photo-polymer material providing an insulated path of conductive material electrically connecting the first and second coaxial conductors.

5. The invention in accordance with claim 1, wherein said seventh and eighth layers have predetermined patterns of conductive and photo-polymer material providing an insulated coaxial feedthrough connection to said second coaxial conductor.

* * * * *